United States Patent [19]

Johnson et al.

[11] Patent Number: 4,679,085
[45] Date of Patent: Jul. 7, 1987

[54] DIGITAL INTEGRATED ELECTRONIC STORAGE SYSTEM FOR VIDEO AND AUDIO PLAYBACK

[75] Inventors: Robert R. Johnson, Franklin; Walter E. Chapelle, Southfield, both of Mich.

[73] Assignee: Energy Conversion Devices, Inc., Troy, Mich.

[21] Appl. No.: 678,165

[22] Filed: Dec. 4, 1984

[51] Int. Cl.$^4$ .......................... H04N 5/14; H04N 7/04
[52] U.S. Cl. .................................... 358/160; 358/143; 358/186; 365/105; 365/175; 365/189; 357/2; 357/40; 357/45
[58] Field of Search ............... 358/142, 143, 144, 145, 358/186, 160; 357/2, 40, 45; 365/105, 175, 189, 221, 231, 243

[56] References Cited

U.S. PATENT DOCUMENTS 4,395,764  7/1983  Matsue ............................... 365/221
4,545,111  10/1985  Johnson et al. ...................... 29/574

Primary Examiner—James J. Groody
Assistant Examiner—Michael D. Parker
Attorney, Agent, or Firm—Marvin S. Siskind; Richard M. Goldman

[57] ABSTRACT

An apparatus for displaying in real-time a previously recorded video sequence includes a main memory wherein digitized video gray-scale information is stored for selected non-interlaced fields of video images to be displayed. The memory unit is formed of interconnected substrates. Each substrate is a ROM which includes storage elements and a layer of amorphous silicon alloy which forms an array of diode isolation elements. Column select and read-out circuitry as well as row select circuitry for each of the substrates are formed, on each corresponding substrate, utilizing the same amorphous silicon alloy. Digitized fields of presorted information are read out and stored in pairs in an interpolator circuit which is used to form interlaced fields to be displayed timewise between the digitally stored fields. The digitized fields are converted by a digital-to-analog converter and added to sync signals to form a composite analog video signal adapted to drive a raster scan display unit. Audio information is also stored in the main memory as sampled digital information with two samples per raster scan line. The audio is decoded through audio decoder circuitry and converted to an analog signal in a digital-to-analog converter. The analog and video output may be combined together in a radio frequency modulator to produce a standard transmittable television broadcast signal.

117 Claims, 14 Drawing Figures

DIGITAL INTEGRATED ELECTRONIC STORAGE SYSTEM FOR VIDEO AND AUDIO PLAYBACK

FIELD OF THE INVENTION

The invention pertains to circuits and methods for accessing and displaying previously stored digital information. More particularly, the invention pertains to an electronic system for storing a predetermined sequence of digital information, reading out and sensing the prestored digital information and forming an analog video gray-scale signal usable to drive a television display.

BACKGROUND OF THE INVENTION

The ability to store and retrieve data and other information in an efficient manner has become an extremely important factor in everyday life. The use of computers for example, in both commercial and non-commercial environments has become commonplace. Both magnetic disk drives and magnetic tapes have been used to provide mass storage for applications with large programs or large amounts of data. Video displays of various types, often connected to computers, have also used prestored information.

Magnetic memories, especially in the form of magnetic tape, have been used to store video signals for subsequent replay. The most common form of such memories is used in commercially available video cassette recorders. Such video tapes can be recorded on and replayed many times. However, the playback equipment is electromechanical and of necessity is rather bulky.

An alternate form of a prerecorded video playback memory is the so-called video disk wherein video signals are prerecorded onto a rotatable disk. The commercially available disks are replayed by rotating the disk and sensing the prerecorded video much like a traditional record is played. In this instance also the playback mechanism is electromechanical and bulky. Further, no modifications at all can be made in the field to the information prerecorded onto the video disk.

While magnetic memories have been generally successful and have found wide uses, the disks or tapes are fragile and must be handled with extreme care to avoid bending or other physical damage to the same. Any structural irregularity in a disk can render it useless. Also, the disks or tapes have a finite shelf life and should it be desired to maintain the stored information for a substantial period of time, the stored information should be periodically transferred to a new disk. Further, these disks or tapes can only be read by equipment which is rather complex, with read heads which are fragile, which often require periodic cleaning and service, and which is bulky and not readily portable.

There is thus a need in the art for a video playback system that is electronic as opposed to electro-mechanical in nature and which can take advantage of recent developments in high density, large capacity solid state memories that do not require moving parts. The system should also use interpolation techniques where possible so as to maximize the length of the display for a given memory size.

SUMMARY OF THE INVENTION

The present invention relates generally to a hand-holdable, portable, externally readable information storage system and more particularly to such a system having an electronically readable storage system, an addressing means for addressing the storage system, and timing means for controlling the addressing means all supported on a single common supporting substrate.

In accordance with a preferred embodiment of the invention disclosed herein, the storage system can take the form of a video and audio playback system wherein additional circuitry such as digital-to-analog converters, binary bit decoders, and a sync generator are provided on the common supporting substrate to provide a portable, hand holdable, video and audio playback system adapted to be coupled directly to, for example, a television monitor. A conventional television receiver can also be used if a modulator is included.

In accordance with a specific embodiment, an apparatus and a method are both provided for creating a video display of a selected length from information stored in a passive, non-volatile electronic memory unit small enough to be hand held. The apparatus includes a main memory unit adapted to digitally store in either read-only memory cells or electrically programmable read-only memory cells a plurality of bits corresponding to the gray-scale information for the raster lines of non-interlaced half-frames of video to be displayed on a raster scan display unit. The memory cells are formed from an amorphous silicon alloy which is deposited continuously on a substrate and which forms a distributed array of diodes.

The apparatus also includes video signal formation circuitry adapted to sense information stored in the main memory and to create directly from that information analog gray-scale video signals for stored fields of video and to use two time-adjacent, non-interlaced, fields of stored video information to, by interpolation, create an interlaced field of video information such that the signals presented to the raster scan display unit in real-time correspond to gray-scale signals for horizontal raster lines along with gray-scale signals for interlaced horizontal raster lines.

Audio information can also be stored in the main memory of the apparatus. By means of audio signal formation circuitry, the digitized and stored audio is sensed and converted to an analog representation which is essentially time synchronized with the video display and which can also be reproduced through a raster scan display unit.

In a preferred form of the invention, video information is digitized into three binary bits represented in main memory by three substrates of a selected size and shape which have deposited thereon the amorphous silicon alloy. Said amorphous silicon alloy represents a two-dimensional array of p-i-n type diodes in combination with selectively settable switch material for the purpose of storing a 1 or 0 as a binary bit at a plurality of addressable locations along with orthogonal, spaced apart, address lines with the amorphous semiconductor alloy film being located therebetween.

A preferred form of the present invention also includes row select, column select and read out circuitry adapted to be integrated into each of the three substrates forming a complete hand-holdable memory unit adapted to read out a plurality of three bits in parallel of selected prestored information, such as video gray-scale information, at a rate fast enough such that a standard video display may be maintained in real-time.

In a preferred embodiment of the invention, an interpolator circuit is included which creates interlaced fields of video gray-scale information based on two adjacent noninterlaced fields of video gray-scale information stored in the main memory. The interpolator circuitry includes two storage devices, each large enough to store all of the bits for a field of video gray-scale information stored in the main memory as well as a full binary adder. The adder is connected to the two storage units for the purpose of adding corresponding sets of bits together to form digitized, interlaced, video gray-scale information which is presented to an output digital-to-analog converter between fields of stored video gray-scale information which are read out from the main memory.

The apparatus also includes an audio decoder circuit which senses previously digitized and stored audio information for each raster scan line stored in main memory as well as for each interpolated, interlaced, raster scan line. The audio digitized information is converted in a digital-to-analog converter to an analog audio signal essentially timed synchronously with the displayed video line.

The method includes the steps of reading out from a main memory unit selectively prestored video gray-scale information organized on a non-interlaced field basis, converting prestored information for a first field to an analog video signal while simultaneously reading out the next prestored field of information, interpolating, using digitized information for the two adjacent fields to create information for an interlaced field, converting the interpolated interlaced field information to an analog video signal, and converting the prestored information for the second field into an analog signal simultaneously with reading out another field of information from main memory. The method can also include continuously sensing in the information read out from the main memory, digitized audio information, and converting the digitized audio information to an analog signal time synchronously with the corresponding video gray-scale signal.

The method can further include the steps of reading out information for a field from main memory and writing it into a first temporary memory, reading that field of information from the first temporary memory and converting it to an analog video signal while simultaneously reading out information for the next prestored field from main memory and writing that next field of information into a second temporary memory, combining corresponding elements from the first and second field together to form interpolated elements for an interlaced field, converting the interlaced field elements to an analog video signal and reading out and converting the field information in the second temporary memory while simultaneously writing information for the next prestored field into the first temporary memory.

DETAILED DESCRIPTION OF THE PREFERRED EMBODIMENT

Figure 1:
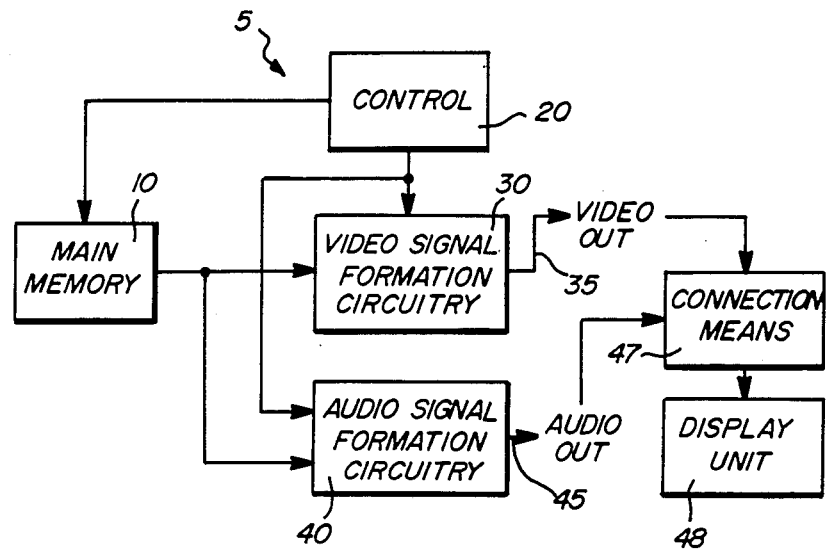
FIG. 1 is an overall block diagram of a system embodying the present invention.

With reference to the figures, FIG. 1 shows an overall block diagram of a system 5 of a particular embodiment of the present invention. In FIG. 1 a main memory 10 is shown interconnected to a control unit 20, video signal formation circuitry 30, and audio signal formation circuitry 40.

The video signal formation circuitry 30, based on bits of information stored in the main memory 10 and synchronizing signals from the control unit, creates a raster scan video signal on a video output line 35. Similarly, the audio signal formation circuitry 40, based on information stored in the main memory 10, creates an audio signal on an audio output line 45. The video signal on the line 35 and the audio signal on the line 45 through a connection means 47 can be used to drive a standard black and white raster scan television receiver or can be separately coupled to a video monitor or display 48. One particular application of the system 5 shown in FIG. 1 is where a read-only memory (ROM) or an electrically programmable read-only memory (EEPROM) is used as the main memory 10 and the system 5 is used to display a prestored message, commercial or sequence on the video display unit 48.

Figure 2A:
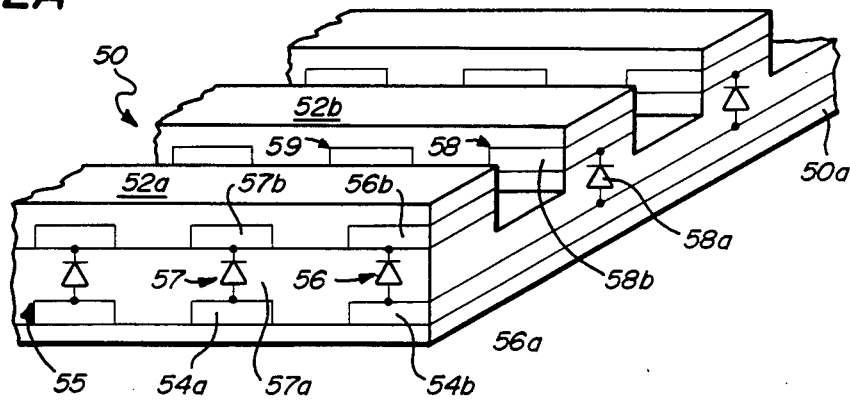
FIG. 2A is a schematic representation of a memory plane incorporated into a preferred embodiment of the invention.

FIG. 2 discloses a memory unit 50 of a type that could be used advantageously in the main memory 10 in the system 5 of the present invention. As shown in FIG. 2A, the memory unit 50 includes a substrate 50a of a selected size and shape on which are formed two sets of orthogonal address lines of which a first set having elements or lines 52a, 52b and a second set having elements or lines 54a, 54b are exemplary. The lines 52a, 52b and 54a, 54b are formed on opposite sides of a layer of amorphous silicon 55. At the intersection of the orthogonal members 52, 54 is formed a ROM cell or EEPROM cell in the amorphous layer between the address lines. Typical cells 56, 57, 58 are shown in the layer 55.

One form of storage unit 50 which is particularly adapted to the present invention is an amorphous silicon memory unit where each of the storage cells such as 56 through 58 is formed of a p-i-n type diode which might also include in electrical series therewith a settable material such as an exemplary settable element 56b adapted to define a bit of information to be stored in each of the cells 56 through 58 as being a 1 or a 0. Such storage units were disclosed in previously filed U.S. patent applications, namely: Ser. No. 458,919, filed Jan. 18, 1984, entitled "Electronic Matrix Arrays And Method For Making Same"; Ser. No. 513,997, filed July 14, 1983, entitled "Electronic Matrix Arrays And Method For Making, Parallel Preprogramming or Field Programming The Same and now U.S. Pat. No. 4,545,111 issued Oct. 8, 1985"; and Ser. No. 558,216, filed Dec. 5, 1983 and entitled "Electronic Matrix Arrays And Method For Making The Same." Said three patent applications have been assigned to the assignee of the present invention. The disclosures of said three patent applications are hereby incorporated by reference herein.

Figure 2B:
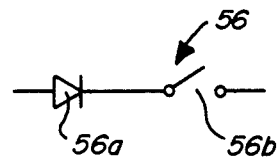
FIG. 2B is a schematic diagram of an exemplary memory cell of the memory plane of FIG. 2A.

In FIG. 2B is a schematic diagram representation of a typical memory cell such as cell 56. The cell 56 includes an isolation diode 56a in series with the settable element 56b which can be electrically set to a high conductivity state or a low conductivity state. The cell 56 can thus store a 1 or 0 for later read out. Such memory cells are disclosed in said above-identified patent applications. The settable element 56b can comprise a phase changeable material.

As disclosed in U.S. Pat. No. 3,530,441 which issued on Sept. 22, 1970 in the name of Stanford R. Ovshinsky, which is assigned to the assignee of the present invention and which is incorporated herein by reference, a phase changeable material is a material which can be altered between a substantially disordered and generally amorphous structure having local order and/or localized bonding for the atoms and a more ordered condition. The changes can be substantially within a short range order itself still involving a substantially disordered and generally amorphous condition, or can be from a short range order to a long range order which could provide a crystalline like or pseudo crystalline condition, all of these structural changes involving at least a change in local order and/or localized bonding. Changes in the local order and/or localized bonding which constitute structural change can be of a subtle nature and provide drastic changes in the material characteristics, such as electrical characteristics or optical characteristics readily usable in determining or detecting the structural changes.

Figure 3:
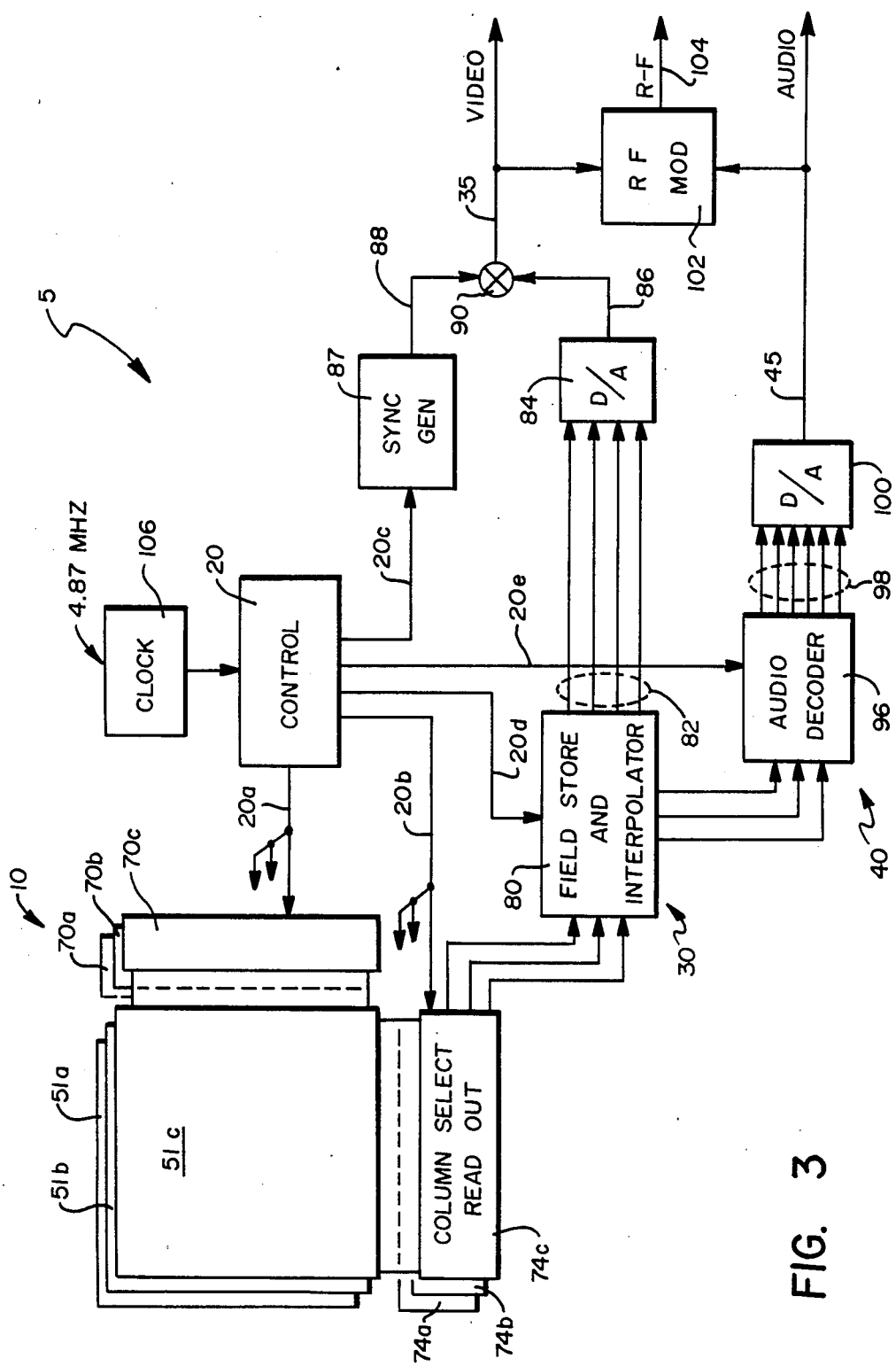
FIG. 3 is a more detailed block diagram of a system embodying the present invention.

A more detailed block diagram of the system 5 is shown in FIG. 3. Blocks which correspond to the elements in Fig. 1 are numbered with corresponding numerals. The system illustrated in FIG. 3 includes the main memory 10 which has in a preferred embodiment three storage units each of which includes a memory unit or plane of a selected size and shape 51a, 51b and 51c. Each of the memory units or planes 51a, 51b, 51c corresponds to the memory unit 50 of FIG. 2A. The main memory 10 includes three sets of row select electronics 70a, 70b and 70c, each of which is associated with a corresponding memory unit 51a through 51c. Further, the main memory 10 includes three sets of column select and read-out electronics 74a, 74b and 74c, each of which corresponds to one of the sets of row select electronics 70a through 70c.

The system 5 as shown in FIG. 3 and the video signal formation circuitry 30 include a field store and interpolator unit 80 which generates a digital video signal on a plurality of lines 82, in real-time. The lines 82 are connected to the digital inputs of a digital-to-analog converter 84 whose output on the line 86 is analog video gray-scale information adapted to control the intensity of the raster as it is being formed on the video display unit 48. The video signal formation circuitry 30 also includes a sync generator 87 whose purpose is to form properly in time with a correct polarity and magnitude the necessary synchronization and control signals, such as horizontal sync and vertical sync, on a line 88. These signals are necessary to control the display unit 48. These signals are well known to those skilled in the art of television. A discussion of them may be found, for example, in *Broadcast Radio and Television*, Sixth Edition, edited by E. Noll, Howard W. Sams & Co., Inc., 1983.

The analog video output on the line 86 is added together with the synchronization signals on the line 88 at a summing point 90. The output of the summing point 90 on the line 35 corresponds to a standard composite video signal without any incorporated audio.

The audio signal formation circuity 40 includes an audio decoder electronic element 96 whose output on a plurality of lines 98 is a digital audio signal which corresponds timewise to the video being generated on the line 35. A digital-to-analog converter 100 receives the signals on the lines 98 and forms an analog audio signal on the line 45. The video signal on the line 35 and the analog audio signal on the line 45 can be combined together with an RF modulator unit 102 for the purpose of creating a transmittable television signal on a line 104.

Figure 5:
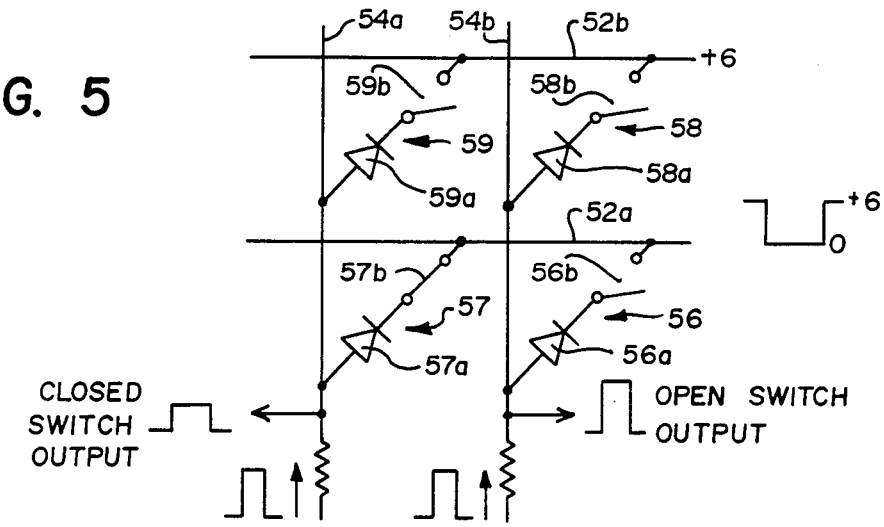
FIG. 5 is an exemplary schematic showing a portion of the memory plane of FIG. 2A along with the column and row select lines.

The control unit 20 shown in FIG. 5 is driven by a clock 106 with 4.87 megahertz clock frequency. The control circuit 20 is connected to the memory 10 by a plurality of control lines 20a and 20b. One of the functions of the control unit 20 is to continually read out from the main memory 10 the previously stored digital gray-scale information at a rate fast enough to drive the display unit 48 in real-time at a standard rate of 60 fields a second with 30 fields/second being interlaced with the other 30 fields/second. The control unit 20 also provides control signals on a line 20c to the sync generator 87, on a line 20d to the interpolator 80 and on a line 20e to the audio decoder 96.

FIG. 4 illustrates schematically a calculation to determine the size in bits required for the main memory 10 so as to drive a display unit 48 with 100 seconds of video. As is well known in the art, standard video produces a display which is refreshed at a rate of thirty frames a second using what is referred to as an interlaced technique. A black and white television display has 525 raster lines per frame, of which about 42 are blanked for retrace purposes. For each field there are 262½ lines of which 21 are blanked lines. Also, as is well known in the art, standard television operates on a principle of displaying a field having approximately 240 unblanked lines in 1/60 of a second, retracing the electron beam to the beginning position at the upper left and then interlacing in between the original 240 lines a second field of 240 lines. The original field and the interlaced field are each written onto the screen in 1/60 of a second, about 16.7 milliseconds.

Figure 4A:
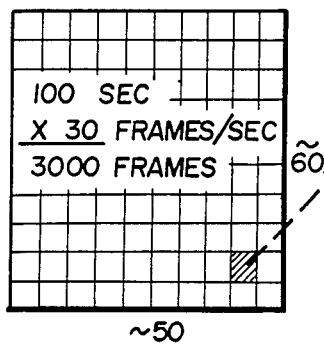
FIG. 4A is a schematic representation of the number of fields of information necessary to display 100 seconds of video.
Figure 4B:
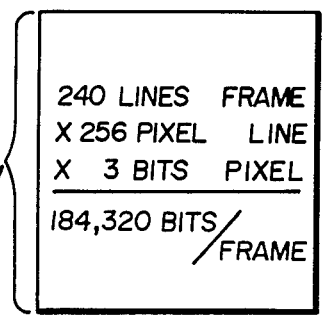
FIG. 4B is a representative calculation illustrating the number of bits needed to be stored to display one field of video.

Based on the above information and assuming that the interlaced fields will be created by interpolation, FIG. 4A schematically indicates the number of fields that must be stored to display 100 seconds video. At 30 fields a second, each displayed in 1/60 of a second, 100 seconds requires 3,000 fields. FIG. 4B discloses a calculation to determine the number of bits of information which must be stored for each of the 3,000. As shown in FIG. 4B, each field has 240 displayable horizontal scan lines. Each scan line has approximately 256 pixels of display locations. In a preferred embodiment, the pixels of information are digitized into 3-bit representations. A multiplication of 240 lines per field, each including 256 pixels per line with a 3-bit representation for each pixel, produces a total of 184,320 bits per field which must be stored. It should be noted that of the 256 pixels per line, eight of these pixels, 24 bits, are used to store the audio information which will be reconstructed along with the video information to create a final output.

For a total of 3,000 frames each requiring 184,320 bits, the final result is that total storage of the main memory 10 must equal $553 \times 10^6$ bits. Main memory 10 stores for repetitive read-out all of the necessary information to display 3,000 fields.

Figure 4C:
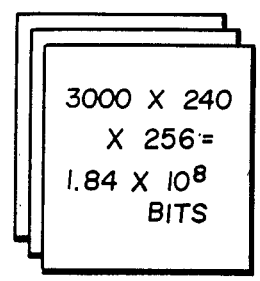
FIG. 4C is a schematic representation of a preferred organization of the memory of an embodiment of the present invention.

FIG. 4C schematically shows one form of organization of the bits on the set of three memory planes or units 51a through 51c. As shown in FIG. 4C, each of the memory planes or units 51a through 51c is associated with one of the three bits necessary to represent each pixel. Each memory plane or unit 51a through 51c must contain enough storage to support 3,000 fields times 240 lines per frame times 256 pixels per line which corresponds to $1.84 \times 10^8$ bits. Such a memory plane or unit can be or as 15,000 rows by 12,288 columns.

In a preferred embodiment, the diode portion of each of the storage cells 56 through 59 has the following characteristics: area-2 by 2 microns; maximum current density-DC 20 amps/cm$^2$ corresponding to 0.8 microamps of constant current and pulsed 100 amps/cm$^2$ corresponding to 4.0 microamps of pulsed current; a voltage of 3 volts at 4.0 microamps; and the thickness of the intrinsic region between the p and the n layers equal to 0.3 microns with a junction capacity of about 0.00133 picofarads.

Retaining the 2 by 2 of the diode in the switch results in the following switch characteristics when a settable material such as $Si_{50}C_{50}$ disclosed in the previously identified and incorporated patent applications is used: $R_{off}$ is greater than $10^6$ ohms, $R_{on}$ is approximately $10^2$ ohms with a switch thickness on the order of 0.08 microns resulting in a parallel capacitance of 0.005 picofarads. With the above characteristics, the size of the memory units or planes 51a through 51c, as in FIG. 4C, is on the order of 2⅜ inches high by 2 inches wide. Hence, the system 5 of the present invention can readily include a main memory 10 which is portable and, in fact, holdable in one's hand.

Given the memory organization shown in FIG. 4C, each field of video and audio information which is stored takes five rows of the 15,000 rows indicated.

FIG. 5 shows a schematic in more detail of a part of the memory unit 50 of FIG. 2. FIG. 5 also corresponds to the structure of each memory unit 51a, 51b, 51c. As shown in FIG. 5, storage units 56 through 59 are indicated schematically as diodes in series with settable switches. For example, with respect to storage element 56, the diode 56a is shown in series the settable switch element 56b which in FIG. 5 is indicated as being in an open position. Storage element 57 is shown as a diode 57a in series with a closed switch element 57b. Addressing the elements 56, 57 is accomplished applying appropriate voltages to the column lines 54a and 54b and row line 52a. By selecting a column line 54b and a row line such as 52a, a storage element such as 56 is uniquely selected in each corresponding memory unit 50, 51a, 51b or 51c. Read out circuitry then can be used to sense and read out the position of the switch 56b in 56.

Figure 6:
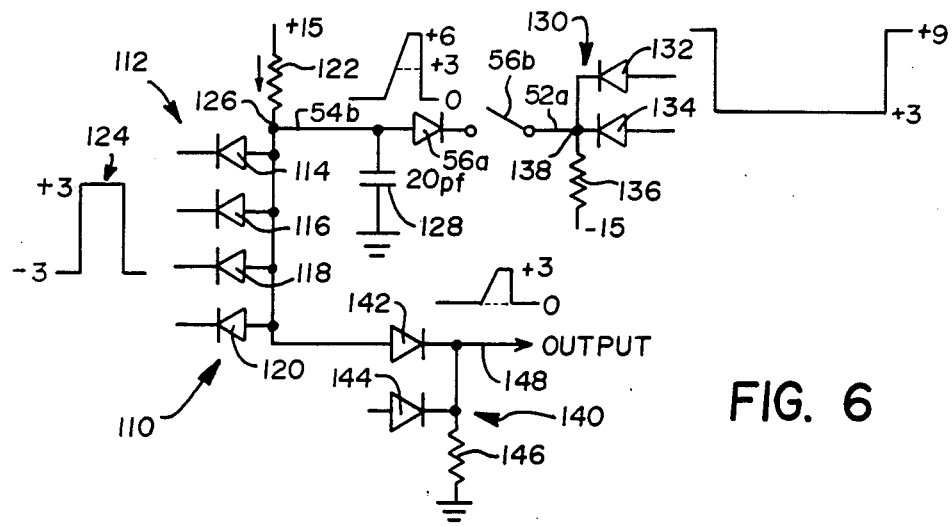
FIG. 6 is a schematic of a preferred circuit for performing the row select, column select, and read out functions for a given column and row.

The switch elements such as the element 56b, are typically formed of a settable material such as $Si_{50}C_{50}$ as disclosed in the above-identified patent applications. By setting the position of the switch 56b, either a 1 or a 0 can be stored in the memory cell 56. Thus, the memory unit 50 is a form of nonvolatile, passive storage. The memory unit 50 can be used as a read-only memory unit (ROM) when the settable switch elements have to be set during the fabrication process or where the settable switch elements can be set or reset only a very limited number of times. The memory unit 50 can be used as an electrically erasable and programmable ROM (EEPROM) where the switch elements are of a type that can be settable and resettable electrically many times. FIG. 6 illustrates an exemplary circuit 110 that can be used to select a desired row, select a desired column, and sense the bit of information, 1 or a 0, stored at the selected memory cell. In the circuit 110 of FIG. 6, a diode AND gate 112 is used to select a column such as exemplary column 54b. The AND gate 112 includes selection diodes 114 through 120 and pull-up register 122.

Column selection signals are applied to the cathodes of the diodes 114 through 120. An exemplary selection signal 124 is shown on FIG. 6. Selection signal 124 is nominally at $-3$ volts when a diode is not being selected and goes to $+3$ volts for each of the diodes 114 through 120 as they are selected. In order to select the column 54b, each of the diodes 114 through 120 must be reverse biased by a select signal such as $+3$ volts at a cathode thereof. In such an instance, the voltage at the anode 126 attempts to rise toward a 15 volt potential through a resistor 122. Diodes 114 through 120 become forward biased when the voltage at the node 126 approaches $+6$ volts.

Attached to the node 126 is a column shunt capacitor 128 of 20 picofarads. The 20 picofarads corresponds to estimated shunt capacitance of column 54b. Also attached to the node 126 is an anode end of the diode 56a of the storage element 56. Also as shown in FIG. 6, the switch 56b of the memory unit 56 is open indicating that a 0 is being stored at that location.

Connected to the other end of the switch 56b by means of the row 52a is a second diode AND gate 130. AND gate 130 includes two diodes 132 and 134 along with a resistor 136. The cathodes of the diodes 132, 134 and one end of the resistor 136 are connected together to at a node 138 which in turn is connected to the row to be selected such as 52a.

To select row 52a, a $+3$ volt signal is applied to the anode of each of the diodes 132, 134. Due to the $-15$ volt bias at the other end of the resistor 136, the voltage at the node 138 is clamped to approximately 0 volts. Thus, while the AND gate 112 would permit voltage at the node 126 to rise toward a positive voltage of six volts, the diode 56a in the storage cell 56 clamps that node at $+3$ volts for a closed switch 56b. In the event that switch 56b is open, the voltage at the node 126 is permitted to rise toward six volts when the diode gate 112 is enabled.

Also connected to the column 54b is a read-out circuit 140. The read-out circuit 140 includes diodes 142, 144 and load resistor 146. The elements 142, 144 and 146 form a diode OR gate. When the switch 56b is open and the voltage at the node 126 rises toward six volts, a 3 volt drop across the diode 142 will result in a 3 volt output on an output line 148. If the switch 56b is closed, the node 126 is clamped at +3 volts resulting in a 0 volt output on the line 148.

A plurality of diodes in addition to the diodes 142, 144 can be attached to the load resistor 146. As a result, a group of columns can be ORed together to reduce the number of read-out circuits and read-out lines that are required for the memory. In a preferred embodiment, as will be discussed further subsequently, twelve columns are ORed together in output OR gates such as the circuit 140. The resistor 122 has a value which is selected so that the current therethrough will not exceed 1.2 microamps. The 1.2 microamps is a maximum desired current which can be permitted to flow through any one of the select diodes 114 through 120.

In a preferred embodiment, the selection diodes such as 114 through 120, 132 and 134 as well as the output diodes 142, 144 all are formed on the memory plane such as 51a using the same type of amorphous silicon alloys that are used to form the memory cells as 56. Specifically, these selection diodes, which form diode gates, may be formed in the layer 55 of amorphous silicon alloy. Resistive elements 122, 146 can be formed in a conventional fashion also on the planar substrate, or attached thereto, that supports the memory plane 51a.

Figure 7:
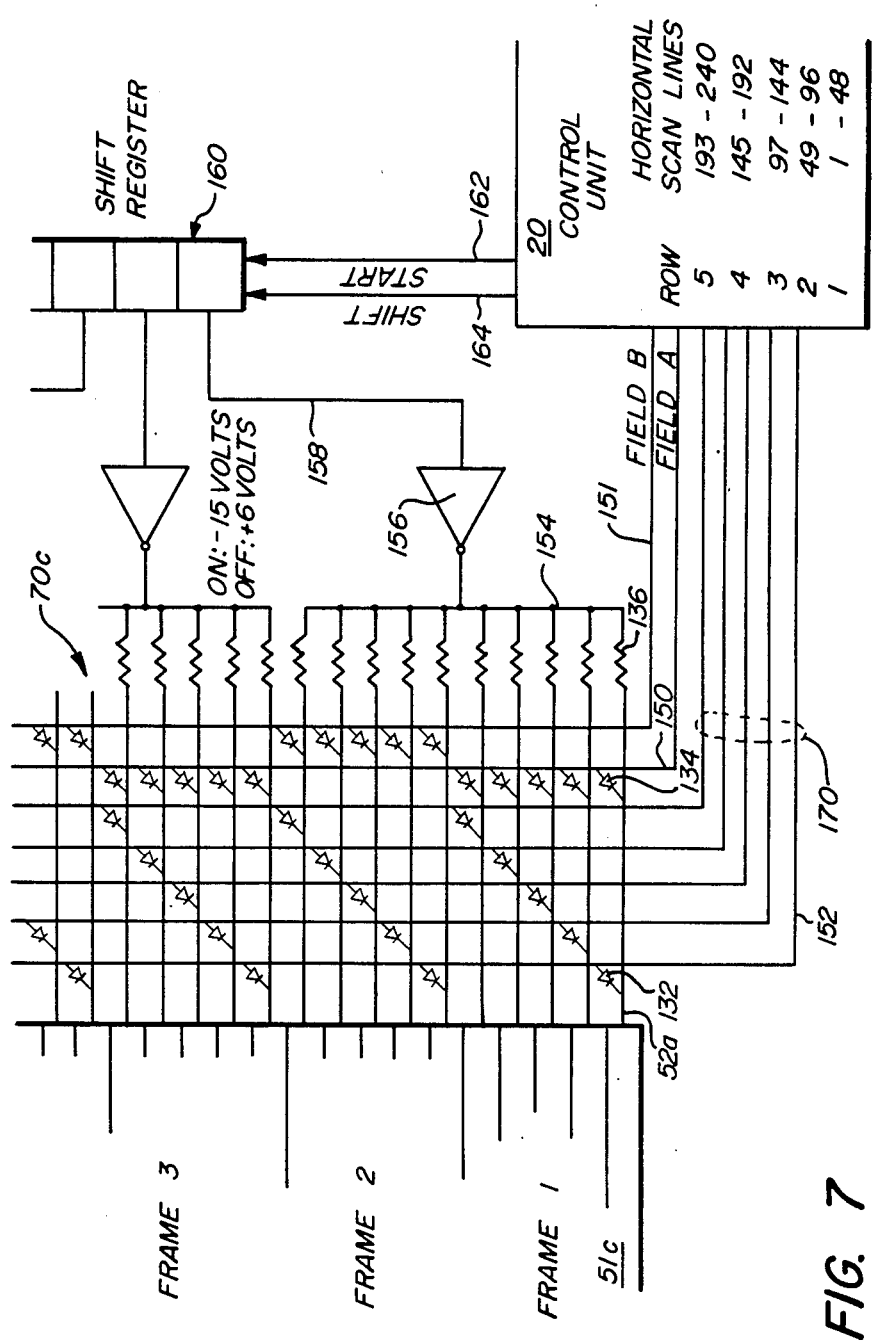
FIG. 7 is a schematic diagram of a part of the row selection circuitry incorporating the row selection AND gate from the circuit of FIG. 6 and showing the connections of those row selection gates to the rows of a memory plane in the main memory.

FIG. 7 shows a more complete schematic of the row select circuitry 70c connected to the planar memory unit 51c. In FIG. 7, row select diodes 132, 134 and load resistor 136 are shown connected to exemplary row 52a of the memory plane 51c. As can be seen from FIG. 7, an anode of the diode 134 is controlled by a line 150 from the control unit 20. The line 150 is used to select which of two frames is currently being read out from the memory 51c. An anode of the diode 132 is connected by a line 152 to a row indicator in the control unit 20. Row 1 of memory plane 51c has stored therein horizontal scan line information for scan lines 1 through 48 of the raster. An end of the load resistor 136 is connected to a line 154 and controlled through an inverter 156 to switch the diode gate 132, 134 and 136 on or off. The inverter 156 puts a −15 volt signal when the gate 132, 134 and 136 is to be enabled and a +6 volt signal otherwise. Inverter 156 is controlled by a voltage on a line 158 which in turn is generated through a shift register 160. The shift register 160 is part of the control unit 20 and has a single bit which recirculates under the control of the control unit 20. The recirculating bit enables selected inverters such as 156 to enable a pair of stored frames in memory plane 51c. The control unit 20 generates start pulses on a line 162 and reset pulses on a line 164 to control the shift register 160.

The additional diode gates shown on FIG. 7 are identical to the two-input AND gate with elements 132, 134, 136. Alternate frames and different rows as selected by control unit 20 are selected by the remainder of the diode gates. Since the memory plane 51c has 15,000 rows, and since these rows are selected in groups of ten by the shift register 160, shift register 160 must have a total of 1500 storage locations.

As can be seen from FIG. 7 as the control unit enables the selection of rows 1 through 5 on a plurality of lines 170 either a first field stored in memory plane 51c can be selected to be read out or a second field, depending on whether field A or field B is enabled by signals on the lines 150, 151. Field A and field B are arbitrary designations which merely refer to two time-adjacent non-interlaced fields which are to be displed one after the other on the raster with an interlaced field be displayed in time between them.

Figure 8:
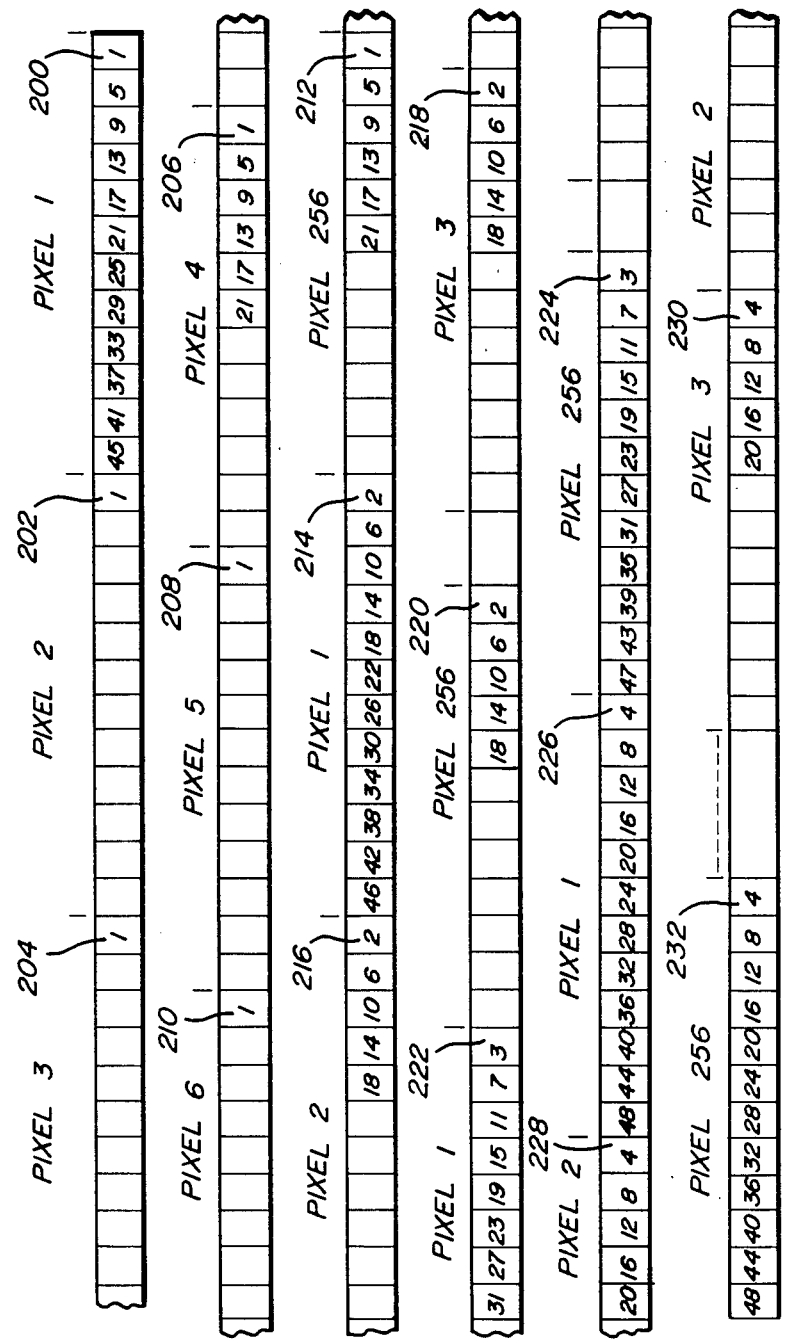
FIG. 8 schematically shows the layout of pixels for a given row of the main memory.
Figure 9:
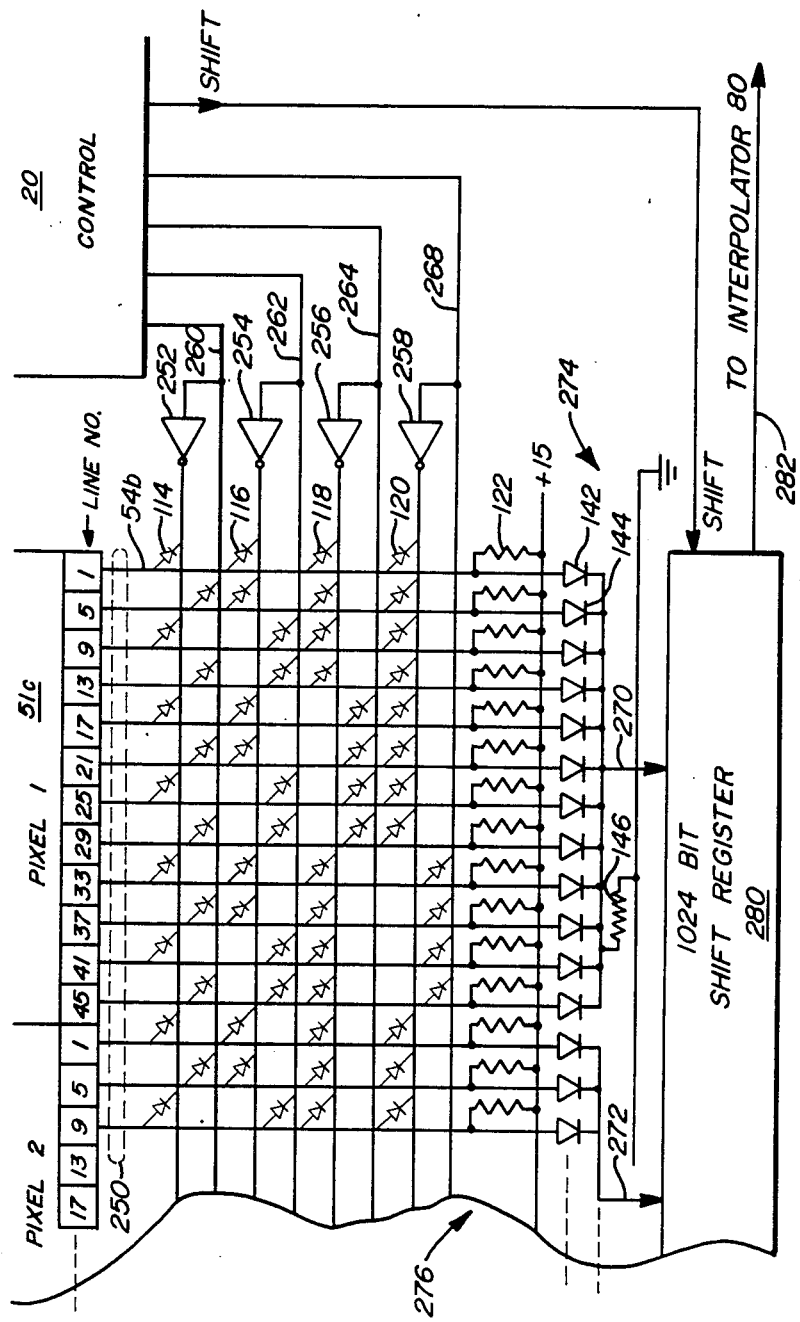
FIG. 9 shows the column select and read out circuitry from FIG. 6 connected to a plurality of columns in a memory plane of the main memory.

FIG. 8 discloses a layout of the data for each group of 48 raster lines which are in a given row of a memory plane such as 51c. FIG. 9 discloses a preferred embodiment of the column select and read-out circuitry based on the data layout as shown in FIG. 8.

FIG. 8 discloses in detail the layout of row 1 of memory plane 51c. The data organization for the other two memory planes 51a and 51b is identical except they correspond to different bits in the 3-bit representation of the video gray-scale signal. The layout of other rows in memory plane 51a is similar except that the data stored therein is for different rows of the raster or for different fields. As can be seen from FIG. 8, row 1 of the memory plane 51c is organized with the pixels for line number 1 of the raster distributed horizontally on the row. Each pixel for line number 1 is twelve locations from each adjacent stored pixel for line 1. For example, at the top righthand corner of FIG. 8, element 200 corresponds to pixel 1 of line number 1. Element 202 corresponds to pixel 2 of line number 1. Elements 204 through 210 correspond to pixels 3 through 6 for line 1.

For space purposes, not all of the pixels between 6 and 256 have been shown with respect to line 1. However, element 212 corresponds to pixel number 256 for line 1. Further, spaced laterally along the row from pixel 256 for line 1 is pixel 1 for line 2 which is indicated as element 214. Similarly elements 216 through 220 correspond to pixels 2 through 256 for line 2. Distributed laterally along the row from pixel 256 for line 2, number 220, is element number 222 which is pixel 1 for line 3. The pixel 2 through 256 for line 3 are distributed laterally along the row with element 224 corresponding to pixel 256 for line 3. Spaced laterally from pixel 256 of line 3 is an element 226 which is pixel 1 for line 4. The remaining pixels 2 through 256 for line 4 are distributed laterally along the row and are represented by numerals 228, 230 through 232.

As organized, it is thus possible to read 256 pixels for adjacent raster lines 1, 2, 3 and 4 simultaneously out of row 1 shown in FIG. 8 for the memory plane 51c. Also, as shown in FIG. 8, it is next possible to read out in parallel the 256 pixels for lines 5, 6, 7 and 8. The process can then be repeated for remaining of four raster lines up to and including the last raster line number 48 which is contained in row 1. Hence, reading row 1 twelve times will result in all of the video information, as well as the included audio information, being transferred out of row 1 of memory unit 51c.

The organization disclosed in FIG. 8 is incorporated into the circuitry shown in FIG. 9. Shown in FIG. 9 is row 1 of memory unit 51c, corresponding to the detailed diagram of FIG. 8 along with a plurality of column lines 250 which correspond to the 12,288 columns indicated in FIG. 4C. By way of further example, at the end of memory plane 51c of FIG. 9 is shown an exemplary 54b corresponding to the line 54b shown in FIG. 5 as well as in FIG. 6. Also shown connected to line 54b is the set of four diodes 114 through 120 and load resistor 122 which form the selection AND gate 112, as indicated in FIG. 6, for the purpose of selecting each of the pixels for lines 1 through 4 which are read out as a group. Inputs to the cathodes of diodes 114 through 120 are generated by a set of inverters 252 through 258 whose inputs on a set of lines 260 through 268 are generated by the control unit 20 for the purpose of selecting the first group of four raster lines 1 through 4, then the second group of four raster lines 5 through 8, then the third group of four raster lines 9 through 12 all the way through the twelfth group of raster lines 45 through 48. To implement this sequence, lines through 268 contain a 4-bit binary code which is stepped from 0 (0000) through 11 (1011).

As the 256 pixels are read out of memory plane 51c for each of four raster lines, corresponding to a total of 1024 bits in parallel, through a plurality of 1024 output lines, shown as 270 and 272, associated respectively with 12 input OR gate 274 and 12 input OR gate 276, signals are generated which set and reset the 1024 of a shift register 280.

Shift register 280, a 1024 bit shift register, is loaded in parallel and stores 256 pixels for each of four raster lines. Shift register 280 is loaded a total of twelve times to read out the entire data contents of each row of memory plane 51c. When loaded the 1024 bits of shift register 280 are shifted via a line 282 to the interpolator circuitry 80 for the purpose of displaying the stored fields and for generating and displaying the interlaced fields which were not stored in the main memory 10.

The circuitry shown in FIG. 9 with respect to memory unit or plane 51c would, in a preferred mode, be formed integral to the memory unit or 51c. As mentioned earlier, selection diodes used for addressing may be formed in the amorphous silicon alloy layer. For example, the diodes of the diode AND gates and diode OR gates may be formed in the alloy layer. All of the connections and interconnections and would be made on the supporting substrate with a line such as 282 coming off of the substrate, for each of the three bits, and going to interpolator 80. While an exemplary AND gate having diodes 114 through 120 and load resistor 122 has been discussed with respect to column 54b, it be understood that the remaining columns incorporate diode AND gates that work in precisely the same fashion as does the exemplary gate.

Figure 10:
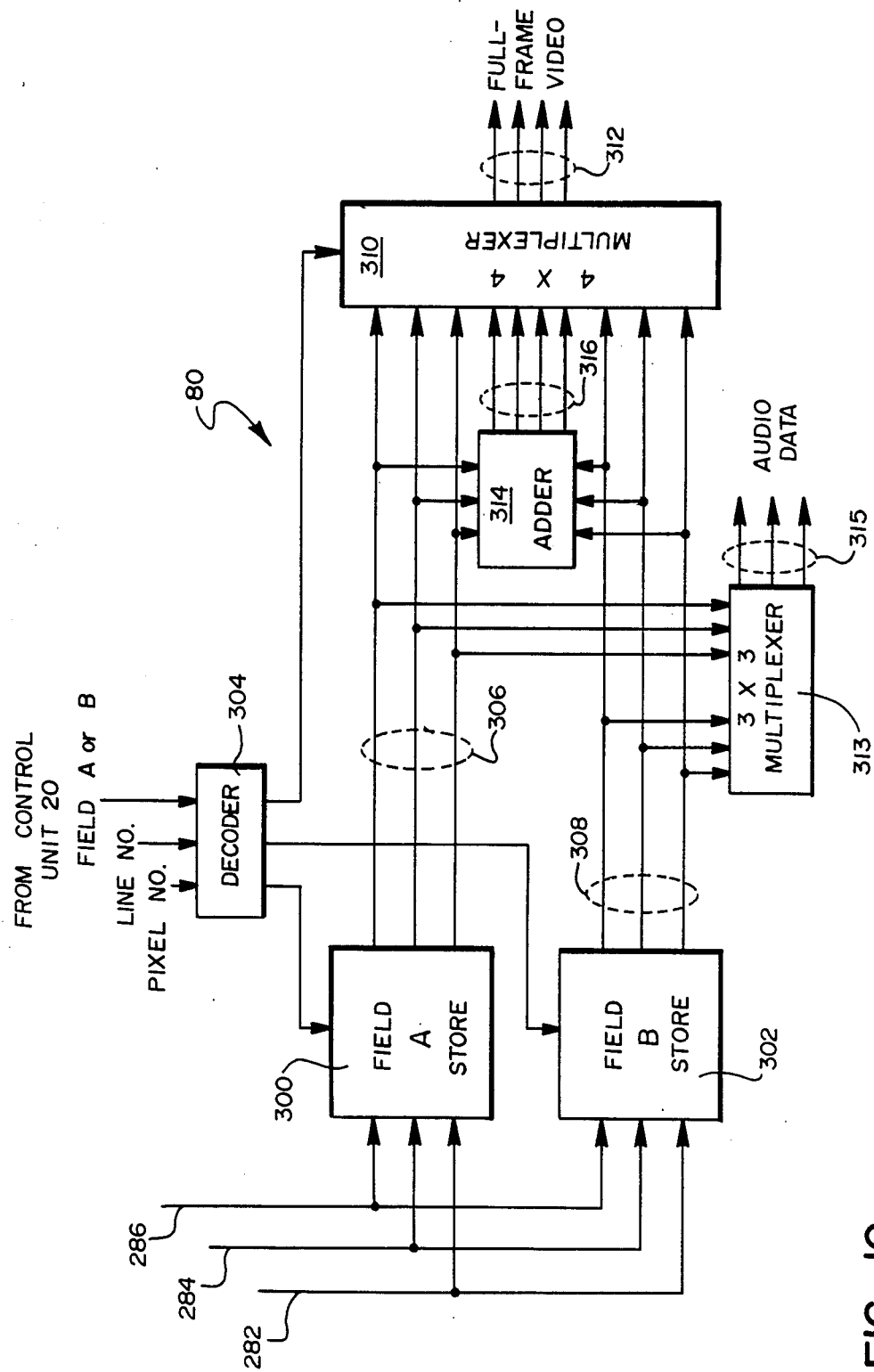
FIG. 10 is a block diagram of an interpolator circuit for the purpose of creating interpolated fields of gray-scale information to be used to create interlaced, non-stored, fields of video.

While the above discussion of FIG. 9 has been with respect to memory unit or plane 51c, it will be recognized that precisely the same circuitry would be used with memory units or planes 51a and 51b to a total of three bits in parallel along lines 282, 284 and 286 as indicated in FIG. 10.

FIG. 10 discloses the detailed structure of the interpolator unit 80. FIG. 10 includes two read/write memory units 300 and 302 arbitrarily as Field A Store and Field B Store. Memory elements 300 and 302 are standard read/write types of memory elements each containing capacity to store 240 lines per frame with 256 pixels per line and three bits for each pixel corresponding to 184,320 bits. The interpolation process is through the control unit 20 as well as decoder 304 which selects which memory 300 or 302 the incoming information lines 282 through 286 is to be stored. Output from memory unit 300 along a plurality of lines 306 and output from memory unit 302 along a plurality of lines 308 is connected to a multiplexer 310. Multiplexer 310 can either gate outputs along lines 306 from memory unit 300 directly to a set of output lines 312, or can gate the outputs on 308 from the memory unit 302 directly to the video output lines 312. Alternately multiplexer 310 can select the result of the interpolation which is performed by the parallel binary adder 314. The output sum from the adder 314 appears on a plurality of lines 316 and is gated to the video output lines 312.

The interpolation process is performed and the result displayed as an interlaced field using stored information from the field displayed immediately before the interpolation and stored information from the field which is to be displayed immediately after the interpolation is completed. The information upon which the interpolation process is based is stored in the memory units 51a, 51b, 51c. The field which results from the interpolation is formed as the mean of the prestored pixel intensity values at each pixel location in the two fields. The interpolation is performed at the parallel adder 314 by addition of pixel intensity values after the values for each location are simultaneously read from the Field A Store 300 and the Field B Store 302. This process results in a four-bit quantity representing each interpolated pixel intensity as the mean of two three-bit quantities. This additional bit is carried through the multiplexer 310 and used in the formation of the analog video signal. When the stored fields are being read directly through the multiplexer 310 to the analog-to-digital converter 84 for display, the fourth or least significant bit is represented as a zero. The prestored intensity pixels are effectively multiplied by two. Alternately, the sum on the lines 316 can be divided by two shifting the sum one binary position to the right as required in forming a mean value.

The sum formed in the interpolation process is a weighted sum. In the present embodiment, the two stored pixel intensity values that are added together are equal weight. Alternate weighting schemes could be used where more than one raster line was to be interpolated between prestored pixel intensity values.

Prior to the start of the read-out and interpolation process, the first 240 line field to be displayed is transferred from the main memory 10 to the Field A Storage 300. The process is then started, and during the first time interval, about 16.7 milliseconds, Field A is read out from storage 300 in parallel form via lines 306 through the multiplexer 310 and onto the lines 312. During this same interval, the next 240 line field is transferred from the main memory 10 to the Field B storage 302. During the next 16.7 millisecond interval, Field A is read from storage 300 and Field B is read from storage 302 in a synchronized manner so that the interpolation can be performed for each pixel location to produce the interlaced field. After the interlaced field has been generated and displayed, Field B in storage 302 is read out in the third 16.7 millisecond interval and the contents of Field A Storage 300 is replaced by the next field from main storage 10. During the fourth interval, another interlaced field is interpolated and displayed. During the fifth interval which is analogous to the first interval, Field A 300 storage is read out and displayed while Field B Storage is loaded with the next field from the main storage 10. The read-out and interpolation process can continue in this manner until the contents of main memory 10 have been displayed.

Thus, a time-varying sequence of digital information is alternately read out of the memories 300, 302 onto the lines 306, 308 at a real-time rate necessary to display an image on the unit 48. The rate at which information is read out of main memory 10 and into Field A Store 300 or Field B Store 302 can be equal to the real-time rate that the information is read out from the storage units 300, 302. Alternatively, read-out from main memory 10 can be faster or slower (a first rate) than the real-time read-out rate (a second rate) from the units 300, 302. The read-out rate from main memory 10 to the memory units 300, 302 can be somewhat slower than the read-out rate from the units 300, 302 by taking advantage of the horizontal and vertical retrace times of the display unit 48 during which no information is displayed. The use of different first and second read-out rates has the advantage that, so long as the first rate is at least one-half the second rate, full advantage can be taken of the speed characteristics of the memory unit 10.

Audio information is also stored in the main memory 10 along with the video line information. Of the 256 pixels per line, the storage space for the last eight pixels are reserved for audio information, corresponding to 24 bits. The audio information is sampled twice during each scan line corresponding to a 31.47 kilohertz sample rate. The information from each of the two audio samples is stored in the memory 10 at the end of the video information for that line. Six bits are used to store the audio information for each sample from a given line. Additionally, the audio for each interlaced line is stored in twelve bits along with the audio for the adjacent non-interlaced line. Hence, while the video for the interlaced lines is interpolated, the audio is stored and carried along as part of the information in main memory 10. When the information in memory 300 or 302 is read out on lines 306 or 308, respectively, and the end of a horizontal line approaches the 12 bits for the audio corresponding to that particular line are gated through multiplexer 313 to the audio decoder circuitry 96.

Figure 11:
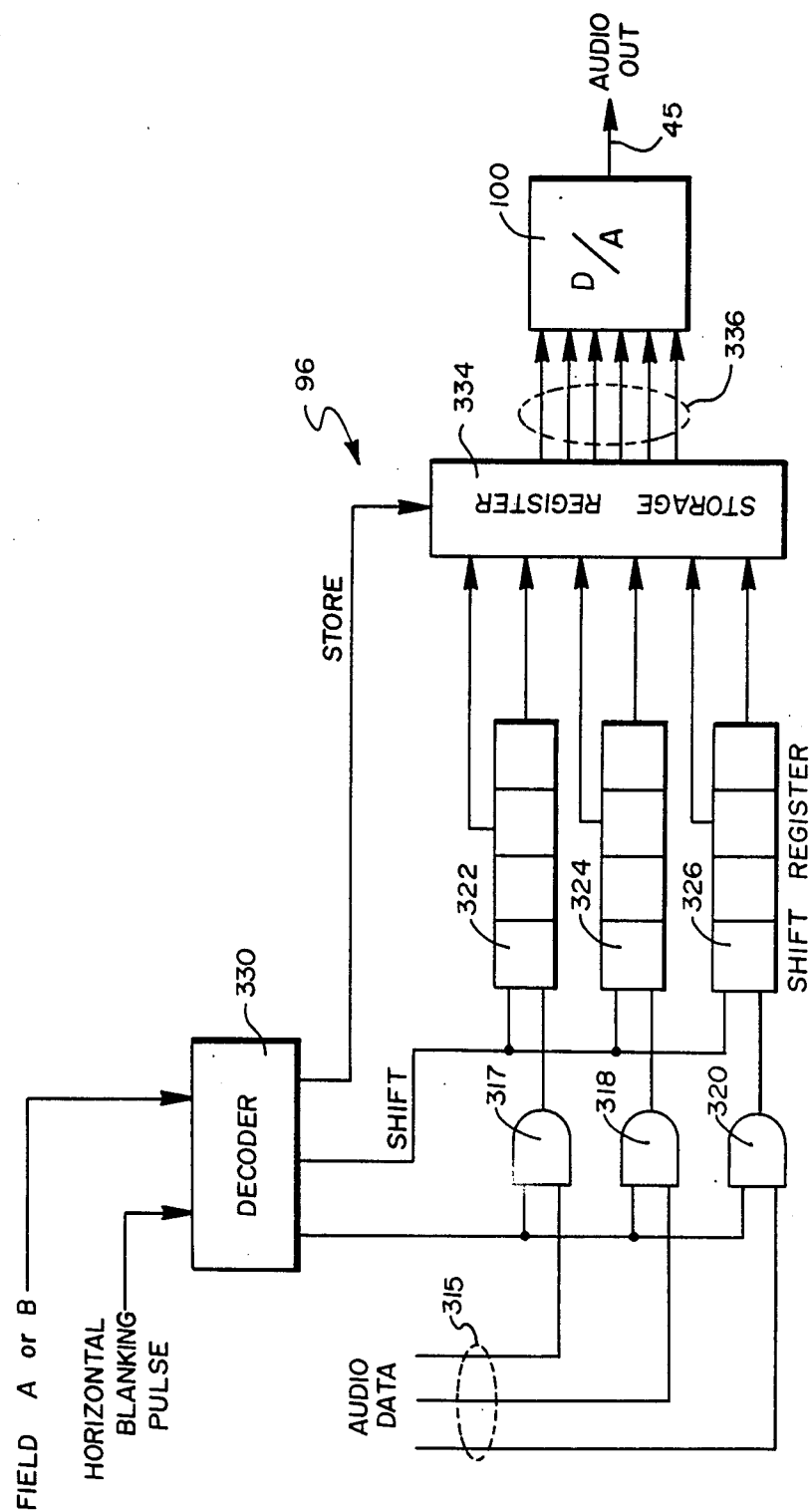
FIG. 11 is a block diagram of the audio decoder circuitry for the formation of analog audio from digitized and stored samples in the main memory.

FIG. 11 discloses an exemplary embodiment of the audio decoder circuitry 96. Audio data is gated through the multiplexer 313 onto the lines 315 and through gates 317 through 320 selectively into shift registers 322, 324 and 326. The capacity of the shift registers 322 through 326 is 12 bits. A decoder 330 is controlled through the control unit 20 to gate the 12 bits of audio information on lines 315 into the shift registers 322 through 326. Six bits of information are then transferred from the shift registers 322 through 326 into a 6 bit storage register 334. The output from register 334 on a set of lines 336 corresponds to six bits of sampled audio which is then fed through the digital-to-analog converter 100 to create an analog audio signal on the line 45.

The analog audio signal on the line 45 is displaced slightly in time from its sample position with respect to a given horizontal raster line. When originally sampled, the first 6 bit sample was taken in the middle of the horizontal scan line and the second 6 bit sample was taken at the end of the scan line. When reconstructed using the audio decoder circuitry 96, the first sample is converted back into an analog signal on the line 45 at the end rather than the middle of the raster line where it was originally sampled, a delay of some 32 microseconds. The second sample of digitized audio is gated through digital-to-analog converter 100 in the middle of the next horizontal scan line, a delay in that sample on the order of 32 microseconds. Similar delays are experienced when the interlaced line is created by the interpolation process and two stored audio samples associated with that corresponding interlaced line are read out from the matching line in the stored field which follows the interlaced field, and is transferred to the digital-to-analog converter 100 at the end of the interpolated line and during the middle of the next interpolated line.

Again, with reference to FIG. 3, the audio output on line 45 can be fed directly to a monitor 48 along with a composite video signal on the line 35. The sync generator 87 is a well understood element which is known in the art, as is the summing point 90 and the RF modulator 102.

In a preferred embodiment, the main memory 10 would include the memory units or planes 51a, 51b and 51c. Each of the memory units or planes 51a, 51b and 51c would include integrated column select and read-out circuity and row select circuitry such as the exemplary column select and read-out circuitry 74c and row select circuitry 70c, all formed a common substrate. The three memory units 51a, 51b, 51c, one for each bit of the video, would then be physically interconnected adjacent one another and connected via the parallel lines 282, 284, 286 to the interpolator 80 and by the lines 20a, 20b to the control unit 20. All of the remaining circuitry such as the control unit 20, clock 106, video signal formation circuitry 30 and audio signal formation circuitry 40 could be integrated with the memory planes 51a, 51b and 51c.

It should be understood that numerous modifications may be made in the form of the invention described above without deviating from the broader aspects of the invention. For example, the broader aspects of the invention include storing and reading-out at a selected frequency additional bits of information associated with a gray-scale of higher resolution or the luminance, hue and saturation components of color such that a raster scan color display could be stored and presented in real-time. The broader aspects of the invention include the use of additional digital or analog processing of the video gray-scale signal generated by the interpolator circuitry so as to improve the quality of the displayed images.

The broader aspects also include the use of any established method of coding the bits representing each pixel, each line or an entire field for storage in the main memory with the limitation that it will be necessary to decode the information to a linear or other continuous representation of each pixel intensity value before the interpolation process is performed. It is also within the broader aspects of this invention to interpolate more than one intermediate field between each pair of stored fields by weighting the pixel intensity values from each stored image according to the position of the field being created within the time interval over which the interpolation is performed. The broader aspects of the invention also include taking advantage of the retrace characteristics of the display unit to be used so that read-out from main memory can take place at a first rate different from a second rate of read-out from the interpolation unit. The broader aspects of the invention include storing in the main memory digital information directed to any desired application.

We claim:

1. A hand holdable, portable, integral memory system comprising:

a supporting substrate;

electrically addressable memory means supported on said substrate for storing information in binary bit form;

addressing means supported on said substrate for addressing said memory means at selected bit locations thereof;

timing means supported on said substrate for controlling said addressing means in a preselected sequence;

coupling means supported on said substrate for interconnecting said memory means, said addressing means and said timing means;

connection means supported on said substrate for providing an external connection to said system;

digital to analog conversion means supported on said substrate for converting said binary bit information into analog form for external read-out; and parallel-in serial-out shift register means supported on said substrate and coupled between said memory means and said conversion means for providing said conversion means with discrete pluralities of binary bit information from said memory means.

2. The system as defined in claim 1 wherein said memory means comprises a non-volatile memory.

3. The system as defined in claim 1 wherein said memory means includes a first means for storing audio information in binary bit form and a second means for storing video information in binary bit form.

4. The system as defined in claim 3 wherein said addressing means includes first addressing means for addressing said first means and second addressing means for addressing said second means.

5. The system as defined in claim 4 wherein said timing means is coupled to said first and second addressing means for causing said first and second addressing means to address said stored audio and video binary bit information in synchronized time relation.

6. The system as defined in claim 5 further including first digital to analog conversion means supported on said substrate for converting said binary bit audio information to analog signals and second digital to analog conversion means supported on said substrate for converting said video binary bit information to analog signals.

7. The system as defined in claim 6 further including sync generator means supported on said substrate for providing said video analog signals with vertical and horizontal synchronizing pulses.

8. The system as defined in claim 7 further including means for combining said video and audio analog signals to form a transmittable signal.

9. The system as defined in claim 8 wherein said connection means are coupled to said combining means to adapt said system for external connection to a television receiver.

10. The system as defined in claim 8 wherein said combining means includes means for superimposing said combined video and audio analog signals on a carrier signal.

11. The system as defined in claim 1 wherein said memory means comprises a read only memory.

12. The system as defined in claim 1 wherein said memory means comprises an alterable memory.

13. The system as defined in claim 12 wherein said memory is optically alterable.

14. The system as defined in claim 12 wherein said memory is electrically alterable.

15. The system as defined in claim 1 wherein said memory is formed of a phase changeable material.

16. The system as defined in claim 15 wherein said phase changeable material is an amorphous semiconductor alloy.

17. The system as defined in claim 15 wherein said phase changeable material is a chalcogenide.

18. A system for producing analog video and audio signals for use, for example, by a television receiver, said system comprising:

a memory matrix including a continuous selection means structure, first and second sets of address lines on respective opposite sides of said selection means structure and crossing at an angle to form crossover points and to define selection devices at said crossover points, and elements of phase changeable material overlying at least some of said selection devices, said elements being in a substantially non-conductive state or a comparatively highly conductive state according to a predetermined pattern which, when addressed in a given sequence, is adapted to provide binary video and audio information signals;

means coupled to said address lines for addressing said elements through said selection devices in said given sequence;

read-out means responsive to said addressing means for determining the state of said elements to provide said binary video and audio information signals; and means for converting said binary video and audio information signals to analog form to provide said analog video and audio signals.

19. A system as defined in claim 18 wherein said matrix includes a first region having only video information-containing elements.

20. A system as defined in claim 19 wherein said addressing means includes video addressing means for addressing said video information-containing elements.

21. A system as defined in claim 20 further including a clock coupled to said video addressing means for sequencing said video addressing means in predetermined time relation.

22. A system as defined in claim 21 wherein said decoding means comprises a video decoding means coupled to said video addressing means for providing said binary video information signals.

23. A system as defined in claim 22 wherein said converting means comprises video converting means and audio converting means for separately converting said binary video and audio information signals to separate analog video and audio signals.

24. A system as defined in claim 22 further comprising a sync generator coupled between said video converting means and said combining means for providing said analog video signal with synchronizing pulses.

25. A system as defined in claim 24 further including means for combining analog audio signals together with said analog video signals.

26. A system as defined in claim 25 wherein said combining means comprises a radio frequency modulator.

27. A system as defined in claim 18 wherein said converting means comprises a digital-to-analog converter.

28. A system as defined in claim 24 wherein said video converting means comprises a digital-to-analog converter.

29. A system as defined in claim 18 further including a parallel input-serial output shift register coupled between said read-out means and said converting means.

30. A system as defined in claim 18 further comprising a sync generator coupled to said converting means for providing said analog video with synchronizing pulses.

31. A system for producing analog audio signals, said system comprising:

a memory matrix including a continuous selection means structure, first and second sets of address lines on respective opposite sides of said selection means structure and crossing at an angle to form crossover points to define selection devices at said crossover points, and elements of phase changeable material overlying at least some of said selection devices, said elements being in a substantially non-conductive state or a comparatively highly conductive state according to a predetermined pattern which, when addressed in a given sequence, is adapted to provide binary audio information signals;

means coupled to said address lines for addressing said elements through said selection devices in said given sequence;

read-out means responsive to said addressing means for determining the state of said elements to provide said binary audio information signals; and means for converting said binary audio information signals to analog form to provide said analog audio signals.

32. A system for producing analog video signals, said system comprising:

a memory matrix including a continuous selection means structure, first and second sets of address lines on respective opposite sides of said selection means structure and crossing at an angle to form crossover points to define selection devices at said crossover points, and elements of phase changeable material overlying at least some of said selection devices, said elements being in a substantially non-conductive state or a comparatively highly conductive state according to a predetermined pattern which, when addressed in a given sequence, is adapted to provide binary video information signals;

means coupled to said address lines for addressing said elements through said selection devices in said given sequence;

read-out means responsive to said addressing means for determining the state of said elements to provide said binary video information signals; and means for converting said binary video information signals to analog form to provide said analog video signals.

33. A high density integrated memory system comprising:

a. means for supporting of a selected size and shape;
b. passive, non-volatile means for storing including a plurality of selectively settable storage locations for storing information bits and formed on said means for supporting;
c. means for selecting one or more of said storage locations at a time, said means for selecting being formed on said means for supporting;
d. means for reading-out time sequentially a plurality of information bits stored in selected locations of said means for storing and selected by said means for selecting thereby forming a time sequential stream of information bits; said means for reading-out being supported on said means for supporting; and
e. means for sensing said time sequential stream of information bits.

34. An integrated high density memory system comprising:

a. a supporting substrate of a selected size and shape;
b. a plurality of passive, non-volatile information storage locations fabricated on said supporting substrate, each said information storage location is settable to selectively store either a one or a zero;
c. means, formed on said substrate, for selecting one or more of said passive information storage locations at a time;
d. means, formed on said substrate, for reading out information stored in each said selected passive information storage location; and
e. means for timing coupled to said means for selecting for sequentially addressing a plurality of said passive information storage locations such that said read-out means senses a time varying sequence of stored ones and zeros and generates a corresponding time-varying signal.

35. A high density system for storing and reading out a plurality of previously stored information bits comprising:

a. means for storing including a supporting substrate with a plurality of passive, non-volatile information storage locations formed thereon;
b. means for control supported on said substrate;
c. means, supported on said substrate, for electrically addressing each of said passive information storage locations and responsive to said means for control for cyclically addressing in parallel selected pluralities of said information storage locations; and
d. means, coupled to said means for addressing, for sensing information stored in one or more of said passive information storage locations addressed by said means for electrically addressing.

36. A display system for driving a raster scan display comprising:

means for storing having a supporting substrate with a plurality of passive, non-volatile information storage locations formed thereon;

means for control;

means, responsive to said control means, for electrically addressing and selecting each of said passive, nonvolatile information storage locations including means for selectively addressing in parallel at a selected rate pluralities of said passive non-volatile information storage locations;

means for reading out coupled to said addressing means for sensing information stored in each selected passive, non-volatile information storage location and for generating a time-varying digital signal based thereon; and means for forming a video signal coupled to said control means and said read-out means for receiving the time-varying digital signal generated by said read-out means and for forming a video signal of selected characteristics for driving the selected raster scan display with each said means being supported on said substrate.

37. The system according to claim 36 including further:

means, coupled to said control means and said read-out means, for forming a selected audio signal in response to a selected part of said time-varying digital signal.

38. The system according to claim 36 wherein said means for forming a video signal include:

means for generating additional video signals including means for interpolating between selected first and second parts of the digital signal generated by said read-out means and for forming a time-sequential digital gray-scale signal including the first selected part of the digital signal, a digital signal created by interpolating between the first and second parts of the digital signal and the second selected part of the digital signal.

39. The system according to claim 38 wherein said means for interpolating include:
   means for summing; and
   first and second means for temporary storage coupled to said means for summing.

40. The system according to claim 39 wherein said means for interpolating include:
   means for multiplexing coupled to said first and second temporary storage means and to said means for summing.

41. The system according to claim 38 wherein said means for interpolating include:
   means for forming a weighted sum.

42. A system for generating a video signal adapted to drive a raster scan display unit comprising:
   non-volatile, passive means for storage including a plurality of information storage locations adapted to store a plurality of bits of information therein and including thereon means for sequencing and means for addressing each said bit of information, said addressing means being responsive to said sequencing means for addressing in parallel selected groups of locations in said means for storage in a predetermined sequence at a selected frequency;
   means for sensing coupled to said means for storage for sensing in parallel bits of information read out from said selected groups of addressed locations; and
   means for forming a video signal from said sensed outputs from said selected groups of addressed locations.

43. The system according to claim 42 including further:
   means for generating an audio signal based on selected bits of information read out from said means for storage.

44. The system according to claim 42 wherein said means for storage include a plurality of substrates of a selected size and shape wherein each substrate has deposited thereon an amorphous silicon alloy of a selected type with an array of diodes formed therein, one diode being located at each said information storage location; and
   wherein said addressing means include, on each said substrate, first and second spaced apart, orthogonal sets of address lines with said amorphous silicon alloy positioned therebetween.

45. The system according to claim 44 wherein said means for forming a video signal include means for temporarily storing at least a first set of information bits corresponding to a first part of a frame to be displayed on the raster scan display unit as well as means for interpolating for synthesizing a set of information bits corresponding to a second part of said frame to be displayed on the raster scan display unit after said first part of said frame has been displayed.

46. The system according to claim 45 including means for generating an audio signal.

47. The system according to claim 42 wherein said means for storage has information stored therein in a plurality of selected spaced apart locations and said means for sensing include means for collecting said information in parallel from said spaced apart locations at a selected rate with said means for forming a video signal generating a corresponding video signal for the raster scan display unit.

48. The system according to claim 47 wherein said means for collecting include means supported on said means for storage for shifting during a selected period of time collected information read out from said means for storage.

49. The system according to claim 42 wherein said means for forming a video signal include means for interpolating between selected pairs of bits of information from said means for storage for forming an interpolated portion to the video signal.

50. The system according to claim 49 wherein said means for interpolating include:
   means for forming a sum.

51. The system according to claim 49 including means for forming a weighted sum.

52. The system according to claim 42 wherein said means for addressing include a plurality of selectively coupled diode AND gates formed integral to said means for storage.

53. The system according to claim 42 wherein said means for sensing include a plurality of selectively coupled diode OR gates formed integral to said means for storage.

54. The system according to claim 43 wherein said means for generating an audio signal include means for shifting coupled to said means for storing and a digital-to-analog converter coupled to said shifting means for converting digital bits of information stored in said shifting means to the audio signal.

55. The system according to claim 42 wherein said passive storage means include:
   first and second sets of spaced apart address lines with members of said first set of address lines being at an angle to members of said second set of address lines; and
   amorphous silicon alloy positioned between said first and said second sets of address lines with diodes formed therein between selected spaced apart crossovers of a member of said first set of address lines and a member of said second set of address lines.

56. The system according to claim 55 including further:
   means settable to a high or a low conductivity for selectively storing a binary bit with said settable means being positioned at selected of said crossovers and connected to a respective diode.

57. A system for generating a video signal comprising:
   means for storing a plurality of binary bits of information including a substrate with a layer of a selected amorphous silicon alloy deposited thereon between first and second pluralities of address lines with members of said first plurality of address lines being adjacent a first surface of said layer of amorphous silicon alloy and with members of said second plurality of address lines being adjacent a second surface of said layer of amorphous silicon alloy with said members of said first plurality being orthogonally oriented with respect to said members of said second plurality so as to form an array of addressable storage locations with each said location including an isolation diode;
   means for control carried by said substrate;

means carried by said substrate for addressing each of said storage locations, said means for addressing being coupled to said address lines and responsive to said control means for cyclicly addressing selected storage locations at a predetermined rate and including means for sensing a selected plurality of binary bits of information stored in said addressed storage locations; and means, coupled to said means for sensing, for converting a plurality of sensed binary bits of information to a time-varying analog video signal.

58. The system according to claim 57 wherein: said means for addressing include a first plurality of diode gates, each member of said first plurality of diode gates being coupled to a member of said first plurality of address lines.

59. The system according to claim 58 wherein said first plurality of diode gates is formed in said layer of amorphous silicon alloy.

60. The system according to claim 58 wherein: said means for addressing include a second plurality of diode gates, each member of said second plurality of diode gates being coupled to a member of said second plurality of address lines.

61. The system according to claim 60 wherein said second plurality of diode gates is formed in said layer of amorphous silicon alloy.

62. The system according to claim 57 wherein: said converting means include first and second means for temporary storage.

63. The system according to claim 62 wherein: said converting means include means for selecting said first or second means for temporary storage and digital-to-analog means for changing selected first or second pluralities of binary bits from said temporary storage means to an analog signal on an output line.

64. The system according to claim 63 wherein said means for sensing include means for transferring the plurality of sensed binary bits to said first or said second means for temporary storage.

65. The system according to claim 64 wherein said converting means include:

means for adding coupled to said first and second means for temporary storage for selectively summing binary bits of information stored in corresponding locations of said first and second temporary storage means.

66. The system according to claim 65 wherein said means for adding include means for forming a weighted sum.

67. The system according to claim 65 wherein said means for selecting include:

means for multiplexing coupled to said first and second means for temporary storage and to said adding means for forming a time-varying digital signal partly from a first plurality of binary bits of information read out from said first temporary storage means, partly from a sum of binary bits of information formed by said adding means and partly from a second plurality of binary bits of information read out from said second temporary storage means.

68. The system according to claim 67 including means for forming a weighted sum coupled to said means for multiplexing.

69. The system according to claim 67 wherein said digital-to-analog means for changing are coupled to an output of said means for multiplexing.

70. The system according to claim 69 including further:

means, coupled to said output line of said changing means, for generating sync signals and a composite analog video signal.

71. The system according to claim 70 including further:

means for forming an analog audio signal synchronized with the analog video signal.

72. The system according to claim 71 including further:

means for modulation coupled to said means for generating sync signals and to said means for forming an analog audio signal for forming a standard television broadcast signal.

73. A method of generating a time-varying analog video signal of a selected length from a plurality of bits of digital information prestored in a semiconductor memory comprising:

selecting a plurality of spaced apart locations in the memory and storing a predetermined sequence of digital information therein;

addressing the memory in a predetermined sequence and reading out in parallel therefrom at a selected rate the digital information prestored therein;

sensing the bits of digital information read-out and forming a corresponding time-varying digital sequence; and converting the time-varying digital sequence into a time-varying analog video signal.

74. The method according to claim 73 including:

writing the time-varying digital sequence into a plurality of temporary storage locations at a first selected rate;

reading the contents of said plurality of temporary storage locations at a second selected rate; and converting the digital information read-out at the second rate into the time-varying analog video signal.

75. The method according to claim 74 including:

forming alternately first and second time-varying digital sequences;

writing alternately the first and second time-varying digital sequences into respective first and second pluralities of temporary storage locations at the first selected rate; and reading alternately the first and second time-varying digital sequences out of respective first and second pluralities of temporary storage locations at the second selected rate.

76. The method according to claim 75 wherein reading alternately includes:

forming a third time-varying sequence of digital information of a selected length at the second selected rate between the alternately read first and second time-varying digital sequences.

77. The method according to claim 76 wherein forming the third time-varying sequence includes:

forming a weighted sum of corresponding elements of the first and second time-varying digital sequences as a corresponding element for the third sequence.

78. The method according to claim 76 wherein forming the third time-varying sequence includes:

forming a sum of corresponding elements of the first and second time-varying digital sequences as a corresponding element for the third sequence.

79. The method according to claim 78 wherein forming the third time-varying sequence includes:
dividing each sum element by two so as to form a corresponding element for the third sequence.

80. The method according to claim 78 including:
sensing selected elements of the first and second time-varying digital sequences; and
converting the selected elements of the first and second time-varying digital sequences into an analog audio signal.

81. The method according to claim 73 wherein addressing the memory includes:
forming in parallel a plurality of address signals for addressing a plurality of spaced apart storage locations.

82. The method according to claim 73 wherein sensing includes:
sensing a plurality of bits read out in parallel from a plurality of spaced apart storage locations and converting the plurality of sensed parallel bits to a serial sequence.

83. A system for producing analog video signals, said system comprising:
a memory matrix including a continuous selection means structure, first and second sets of address lines on respective opposite sides of said selection means structure and crossing at an angle to form crossover points to define selection devices at said crossover points, and elements of phase changeable material overlying at least some of said selection devices to form a plurality of addressable storage locations; said elements being in a substantially non-conductive state or a comparatively highly conductive state according to a predetermined pattern which said storage locations when addressed in a given sequence are adapted to read-out prestored binary video information;
means for simultaneously addressing a plurality of spaced apart members of said plurality of storage locations:
means responsive to said means for addressing for sensing the state of said addressed locations to provide said binary video information signals; and
means for converting said binary video information signals from a digital to an analog signal.

84. The system according to claim 83 wherein said means for sensing include:
a plurality of means for gating, each said means for gating being coupled to a selected plurality of members of said first set of address lines for sensing a bit of binary information stored at a selected addressed storage location.

85. The system according to claim 84 wherein each said means for gating include:
a diode OR gate with a selected number of inputs.

86. The system according to claim 85 wherein each said diode OR gate is formed on a selected region of said memory matrix.

87. The system according to claim 84 wherein said addressing means include:
line selection means for selecting a member of said first and second sets of address lines.

88. The system according to claim 87 wherein said line selection means include:
a plurality of diode AND gates wherein each said AND gate selects only one member of said first or said second sets of address lines.

89. The system according to claim 84 wherein said means for sensing include:
means for changing from parallel to serial for transforming a plurality of parallel electrical signals, corresponding to a plurality of sensed binary bits, to a time-varying serial sequence of binary bits having a first rate.

90. The system according to claim 89 including:
first read-write means, coupled to said changing means, for storing at least a first part of the time-varying sequence of binary bits including first means for reading out the stored time-varying sequence of binary bits at a second rate to said means for converting from a digital to an analog signal.

91. The system according to claim 90 including:
second read-write means, coupled to said changing means, for storing at least a second part of the time-varying sequence of binary bits including second means for reading out the stored time-varying sequence of binary bits at the second rate to said means for converting from a digital to an analog signal.

92. The system according to claim 91 including:
means, coupled to said first and second read-write means for storage, for forming a sum, at the second rate, of corresponding binary bits stored in said first and second read-write means for storage.

93. The system according to claim 92 including means for forming a weighted sum.

94. The system according to claim 92 wherein said means for summing include:
a full binary adder.

95. The system according to claim 94 wherein said means for summing include:
means for dividing each sum by a preselected number.

96. The system according to claim 95 wherein said means for summing include a multiplexer.

97. The system according to claim 95 wherein said means for summing include a shift register.

98. The system according to claim 91 wherein said changing means include:
means for shifting the plurality of parallel binary bits to said first or said second read-write means.

99. The system according to claim 83 including means for forming an analog audio signal.

100. The system according to claim 98 wherein said means for shifting include a shift register.

101. The system according to claim 100 wherein said shift register is coupled to said first and second read-write means for storage.

102. The system according to claim 101 wherein said first and second read-write means for storage each include:
a random access memory of a selected size.

103. A hand holdable system for reading out prestored information comprising:
solid state means for storing including a support substrate of a selected size and shape so as to be hand holdable, amorphous silicon alloy formed on said substrate with first and second sets of address lines disposed on spaced apart surfaces thereof at an angle to one another so as to form a plurality of addressable storage locations in said alloy;
means for control coupled to said solid state means;
means, responsive to said control means, for addressing in a predetermined sequence said storage locations in said solid state means, said addressing means being carried on said substrate;

means, coupled to said solid state means, for sensing information prestored in said solid state means; and means, coupled to said sensing means for forming a selected output signal corresponding to the prestored information.

104. The system according to claim 103 wherein said addressing means include:

parallel means for simultaneously selecting a plurality of spaced apart storage locations formed in said alloy layer.

105. The system according to claim 104 wherein said parallel means include:

first means for gating.

106. The system according to claim 105 wherein said first gating means include:

a plurality of diode AND gates formed in said alloy layer.

107. The system according to claim 104 wherein said sensing means include:

parallel means for detecting information prestored in said plurality of selected, spaced apart storage locations.

108. The system according to claim 107 wherein said means for detecting include:

second means for gating.

109. The system according to claim 108 wherein said second means for gating include:

a plurality of diode OR gates formed in said alloy layer.

110. The system according to claim 107 wherein said detecting means include:

parallel to serial means for converting detected information from parallel to a serial sequence.

111. The system according to claim 110 wherein said forming means include:

digital-to-analog means for converting said serial sequence to a corresponding analog signal.

112. The system according to claim 111 wherein said forming means include:

first read-write means for storage coupled to said parallel-to-serial means.

113. The system according to claim 112 wherein said forming means include:

second read-write means for storage coupled to said parallel-to-serial means.

114. The system according to claim 113 wherein said forming means include:

means for summing coupled to said first and second read-write means for storage.

115. The system according to claim 114 wherein said forming means include:

means, responsive to said control means, for coupling said first or second read-write means for storage and said means for summing to said digital-to-analog means.

116. The system according to claim 115 wherein said forming means include:

means for generating an audio signal.

117. The system according to claim 116 wherein said means for generating an audio signal include:

means for detecting digital audio information prestored in said solid state means coupled to an audio digital-to-analog converter.

* * * * *